United States Patent [19]
Naka et al.

[11] Patent Number: 5,902,648
[45] Date of Patent: May 11, 1999

[54] LIQUID APPLICATION METHOD AND METHOD OF MANUFACTURING ELECTRONIC DEVICES USING THE SAME LIQUID APPLICATION METHOD

[75] Inventors: Hiroyuki Naka, Osaka; Masato Mitani, Hirakata; Kazuto Nakajima, Yamatokoriyama; Nobutaka Hokazono, Neyagawa, all of Japan

[73] Assignee: Matsushita Electric Industrial Co., Ltd., Osaka, Japan

[21] Appl. No.: 08/651,304

[22] Filed: May 22, 1996

[30] Foreign Application Priority Data

May 24, 1995 [JP] Japan .................................... 7-124755

[51] Int. Cl.⁶ ...................................................... B05D 3/06
[52] U.S. Cl. .............................. 427/558; 427/64; 427/72; 427/165; 427/169; 427/261; 427/269; 427/287; 427/385.5; 427/407.2; 427/420; 427/443.2; 427/510; 427/559; 427/595

[58] Field of Search ..................................... 427/420, 510, 427/558, 559, 595, 64, 72, 165, 169, 261, 269, 287, 385.5, 407.2, 443.2

[56] References Cited

U.S. PATENT DOCUMENTS

| | | | |
|---|---|---|---|
| 3,578,527 | 5/1971 | Sakata et al. | 427/420 |
| 4,514,439 | 4/1985 | Rounds | 427/420 X |
| 5,429,840 | 7/1995 | Raterman et al. | 427/420 |

*Primary Examiner*—Bernard Pianalto
*Attorney, Agent, or Firm*—McDermott, Will & Emery

[57] ABSTRACT

The present invention aims to form a thin coating film of even thickness within a short processing time under a curtailed consumption of coating liquid; where, a gas is spouted from nozzle 4 disposed facing to protection glass 2 of cathode ray tube, and a liquid containing fluorescent material is made to spout accompanied by the spouting gas, to be applied on protection glass 2 by shifting the positioning of protection glass 2 relative to nozzle 4 while spouting the liquid containing fluorescent material.

14 Claims, 13 Drawing Sheets

LIQUID APPLICATION METHOD AND METHOD OF MANUFACTURING ELECTRONIC DEVICES USING THE SAME LIQUID APPLICATION METHOD

FIELD OF THE INVENTION

The present invention relates to a method of applying liquids on objects such as cathode ray tubes, semiconductor substrates, liquid crystal display substrates, optical disk substrates, etc. for forming a thin film; a liquid application apparatus; a method of manufacturing cathode ray tubes, optical disks and other electronic devices using the same liquid application method; and a nozzle.

BACKGROUND OF THE INVENTION

A liquid application apparatus has been used in applying, for example, liquids containing fluorescent material on a protection glass plate, which makes itself a display part of a cathode ray tube(CRT) for use in a colour television receiver, for forming fluorescent films for three colours, red(R), green(G) and blue(B).

A typical liquid application apparatus for such usage comprises a liquid supply station for dispensing liquids containing fluorescent material, an application station for dispersing liquids within a protection glass, a drying station for drying the applied liquid with a heater, and a plurality of transfer carriages for transferring the protection glass between the stations. The transfer carriage is comprised of a sucking port for sucking/holding the protection glass at the end, and a revolvable support section for revolving and tilting the sucking port.

In such liquid application apparatus, a protection glass is held by sucking with the indention facing upward, and a liquid containing e.g. green fluorescent material is dispensed in the bottom centre of the protection glass at a liquid supply station. The protection glass is then transferred by a transfer carriage to an application station, in which station it is revolved at a slow speed in a tilted posture by slowly revolving a revolvable support section in a tilted position. Taking advantage of a centrifugal force and the tilt, the liquid dispensed in the centre of bottom is dispersed along the inner surface of protection glass to form a thick film of e.g. 300 μm. After such film is formed, redundant liquid is drained by further tilting the protection glass, to be recuperated later. After the formation of a wet film is completed, the protection glass is transferred to a drying station, to be dried by a heater disposed facing to the protection glass; thus the wet film is dried to become a fluorescent film. And then, by a known photo-etching process, a fluorescent film for green colour e.g. is disposed at specified areas. The blue and red fluorescent films are formed by repeating the same process steps twice.

Such a prior art liquid application apparatus, however, is liable to cause unevenness of coating so-called a beach-like irregularity, where the film thickness varies with a concyclic circumferential line as borderline; which occurs due to the viscosity of liquid, because the liquid containing fluorescent material is applied through tilting and revolving of the protection glass. Further, because of the slow revolution speed the film thickness becomes as thick as approximately 300 μm, so it takes a long time for coating and drying, rendering the time for forming a fluorescent film longer. Further, in order for the film to have an even thickness, a large quantity of liquid has to be supplied once, and then redundancy is drained after the coating process is completed. Although the drained liquid can be used again after recuperation, the redundant use of liquid is unavoidable.

SUMMARY OF THE INVENTION

The present invention aims to form a thin coating film under a curtailed use of liquid, within a short period of time, accompanying least occurrence of unevenness in the coating thickness. A liquid application method according to the present invention comprises a spouting process for spouting a liquid along with a gas flow spouted from a nozzle in a plane form disposed facing to an object of application towards said coating object, and a relative-transfer process for shifting the relative positioning of said nozzle and said coating object while spouting the liquid; thereby applies a liquid on an object of coating.

As a liquid is spouted along with a plane form gas flow upon an object of application, the object is coated with the liquid maintaining a specific film thickness by simply shifting the relative positioning between the nozzle and the application object. Through control of the quantity of liquid to be applied, a thin coating film having least unevenness in the thickness can be provided quickly at a curtailed liquid consumption.

In a method of manufacturing cathode ray tubes according to the present invention, a nozzle is disposed facing to a protection glass, and a layer of fluorescent material is formed in specified places on the protection glass by applying a liquid containing fluorescent material along a gas flow spouted from the nozzle in a plane form towards the protection glass, while shifting the relative positioning between the protection glass and the nozzle spouting the liquid.

By so doing, a liquid containing fluorescent material spouts continuously, even if level of the supply quantity is low, led by a gas flow, to be applied swiftly on a protection glass as a thin coating film of even thickness. Taking advantage of the thin coating thickness, a liquid containing flourescent material can be dried within a shorter drying time, and a time needed for forming a fluorescent layer can be made shorter. Further, the thin fluorescent layer of even thickness makes it possible to produce cathode ray tubes having a homogeneous brightness level and an improved white quality.

A method of manufacturing an optical disk according to the present invention forms a layer of ultraviolet ray curing resin on an optical disk substrate by spouting an ultraviolet ray curing resin along with a gas flow spouting in a plane form towards the optical disk substrate from a nozzle disposed facing to the optical disk substrate, while shifting the nozzle from the centre towards the outer circumference of the optical disk substrate keeping the optical disk substrate revolving.

By so doing, an ultraviolet ray curing resin is applied on the surface of an optical disk substrate swiftly and evenly in a form of thin film. Taking advantage of the thin coating thickness, the drying time can be shortened, and a layer of ultraviolet ray curing resin is formed within a short processing time. Thus, an optical disk having a thin layer of ultraviolet ray curing resin of least unevenness in the coating thickness is swiftly obtained.

DESCRIPTION OF THE PREFERRED EMBODIMENTS

A liquid application apparatus according to a first embodiment of the present invention is described in the following referring to FIG. 1 through FIG. 4.

Figure 1:
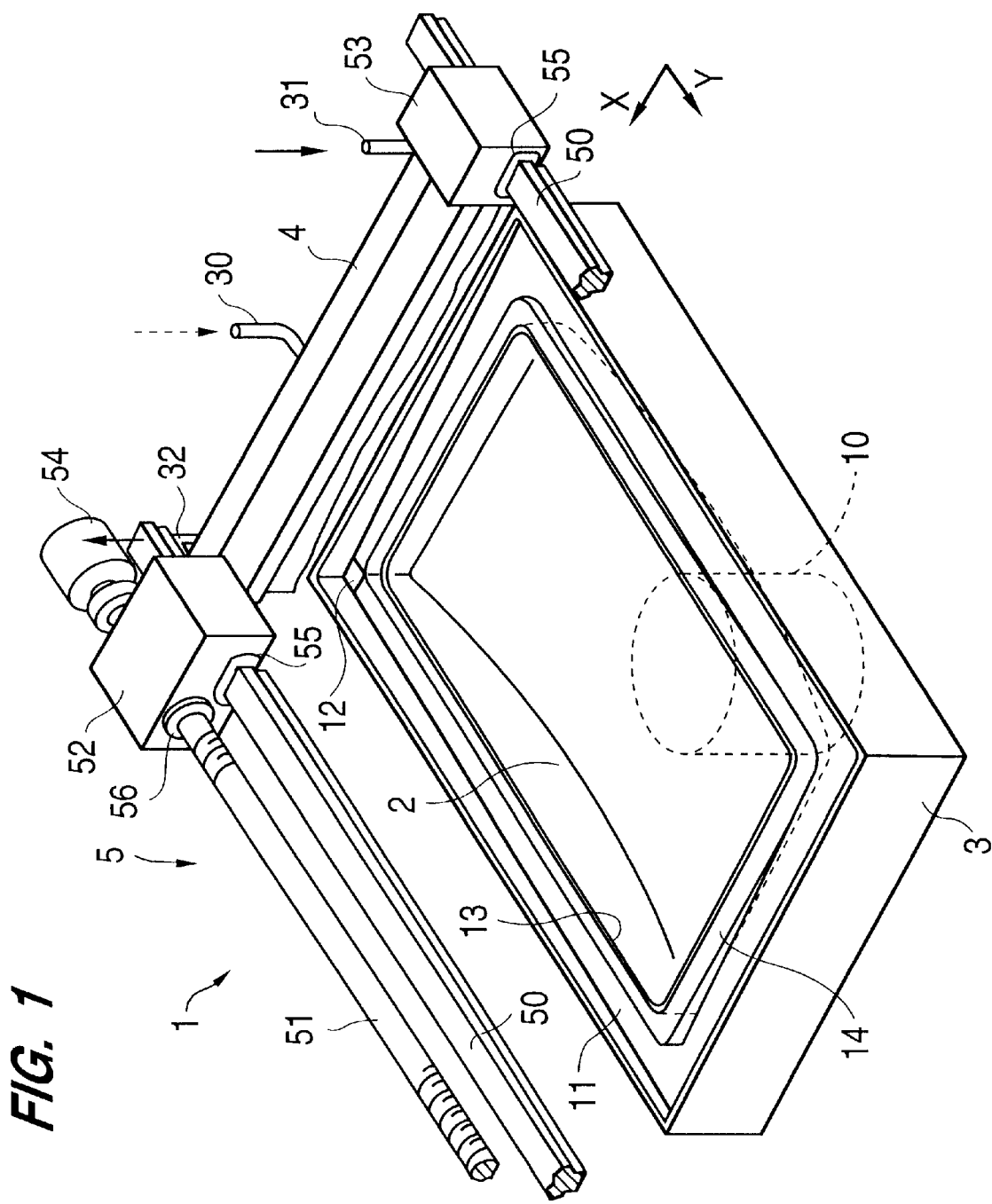
FIG. 1 is a perspective view showing a liquid application apparatus according to a first embodiment of the present invention.

As shown in FIG. 1, a liquid application apparatus 1 comprises a tube holding means 3 for holding a protection glass 2 of e.g. 16:9 aspect ratio cathode ray tubes(CRT) revolvable, a nozzle 4 for spouting a liquid containing fluorescent material to protection glass 2, and a nozzle transfer means 5 for transferring nozzle 4 on tube holding means 3 in Y direction perpendicular to X direction. Nozzle 4 has a slit 20 extending in X direction constituting a spouting section.

Tube holding means 3 is a box-shaped member, having a revolving section 10 driven by a motor at the bottom. The tube holding means 3 comes in various sizes to meet the diversified sizes of protection glass 2 of cathode ray tube, and is attached detachable to revolving section 10. Around the circumferential top surface of tube holding means 3 is a gutter 11 having an inclination for carrying redundant liquid away. A drain hole 12 is provided at the lowest point of gutter 11, through which redundant liquid is drained for reuse. A holding hole 13 of approximately rectangular shape is provided for holding protection glass 2 at the centre of tube holding means 3. Holding hole 13 is shaped to fit the outer circumference of protection glass 2, and is provided with a sealing member 14 at the inner wall surface for preventing leakage of liquid.

Figure 3:
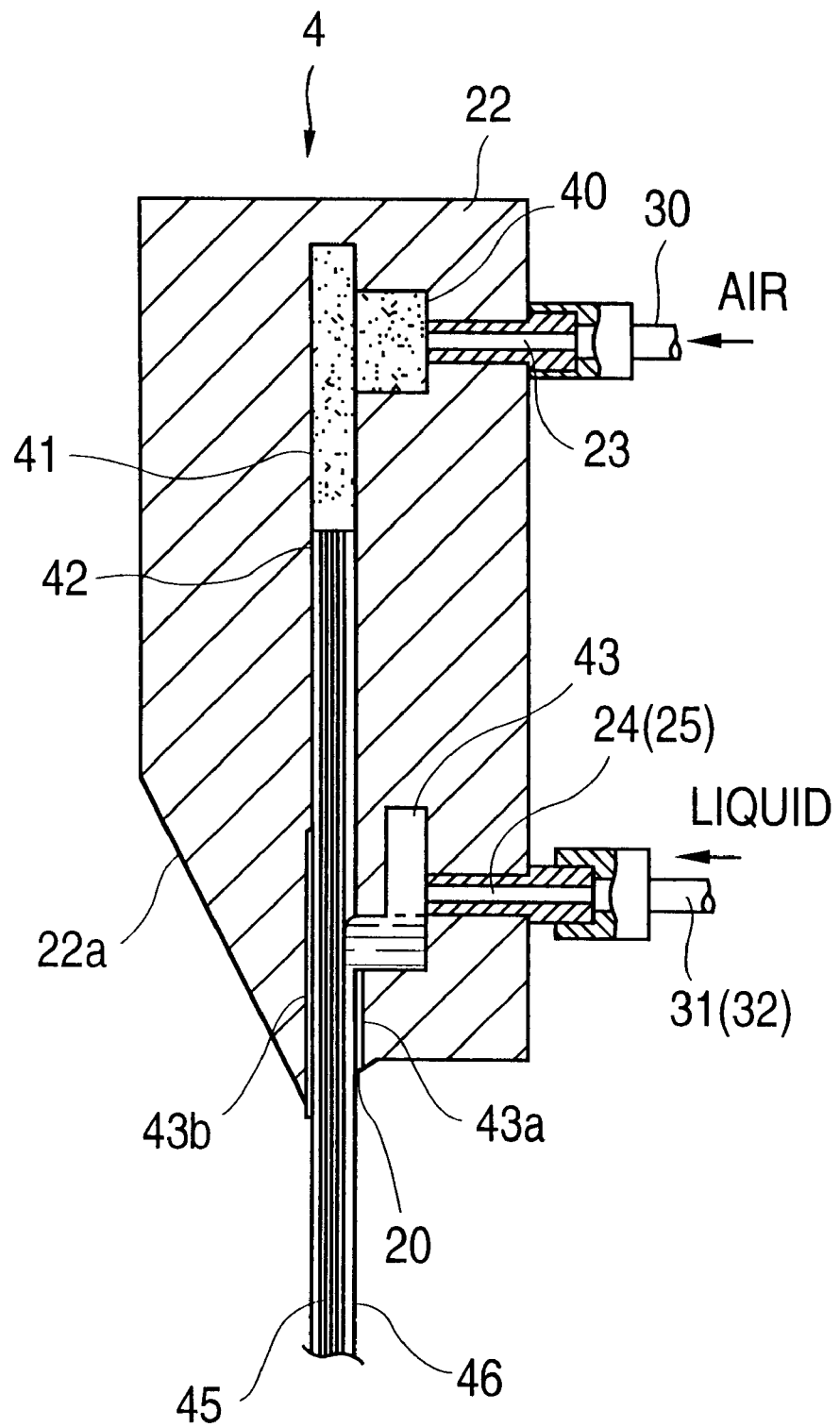
FIG. 3 is a cross sectional view of a nozzle used in the first embodiment.
Figure 4:
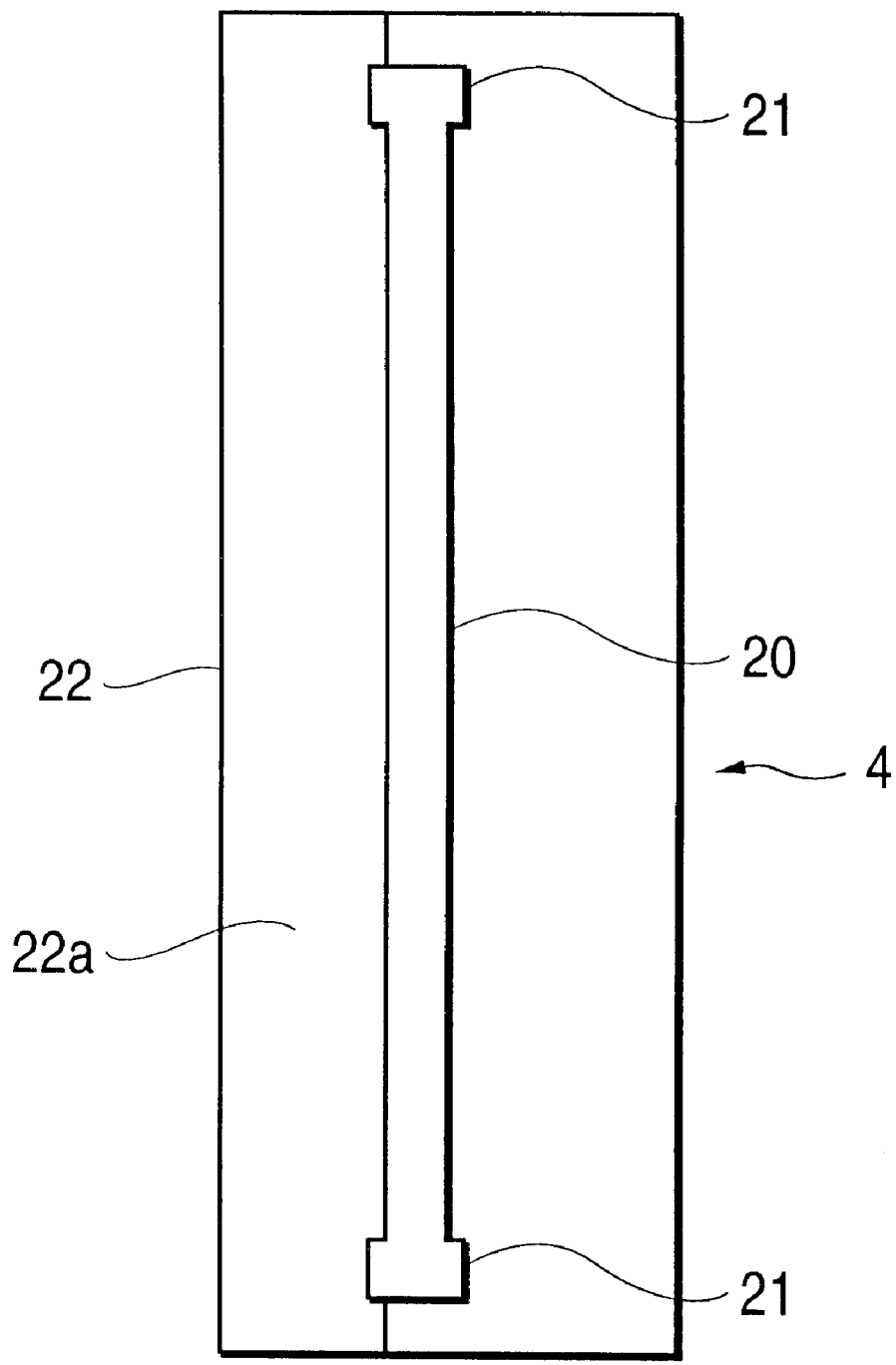
FIG. 4 is a bottom view of a nozzle used in the first embodiment.

As shown in FIG. 3, nozzle 4 comprises a nozzle body 22 of approximately rod shape having an inclination surface 22a at the bottom part. At the bottom of nozzle body 22, a continuous long slit 20 extending in X direction is formed in inclination surface 22a. Slit 20 has a length sufficiently longer than the X length of the largest size protection glass 2, or an object of application. Both ends of slit 20 are provided with a flow leader 21, the breadth of which is broader than the rest, as shown in FIG. 4. By forming flow leader 21 at both ends of slit 20, the liquid spouted is prevented from becoming thin at both ends. However, flow leader 21 is not an essential member. In a case where there are flow leaders 21, the flow volume at both ends of slit 20 goes larger than the rest of the slit, and the thickness of liquid flow at these parts becomes thicker accordingly. The length of slit 20 may be determined so that the liquids from flow leaders 21 are not spouted on protection glass 2.

Within nozzle body 22, there are an air intake 23 for taking the air in at the upper part, and a pair of liquid connections 24, 25 at the lower part for taking in and out a circulating liquid. Air intake 23 is connected with an air hose 30 via connector. Air hose 30 is conncted with a source of compressed air, not illustrated here. Liquid connections 24, 25 are connected with circulation hoses 31, 32 via connectors. Circulation hose 31 is connected with the outgoing side of a circulation pump 33 comprised of a geared pump. Circulation hose 32 is connected with the intake side of circulation pump 33 via valve 36. The intake side of circulation pump 33 is connected via valve 35 with a storage tank 34 for storing a liquid containing fluorescent material. The liquid is made to circulate, for preventing fluorescent material contained in the liquid staying in piping, hose or slit nozzle 20 from settling down while the liquid supply is suspended. When the liquid supply is suspended, valve 35 is shut, while valve 36 is opened to let the liquid circulate through circulation hoses 31, 32, in order to avoid the settling of flourescent material.

Air intake 23 of nozzle body 22 is connected open to an air storage 40, which is an oblong space extending in X direction. Air storage 40 is connected through with an air path 41, which is extending vertically at the central part of nozzle body 22 to make a through connection with slit 20. In the middle of air path 41, there is a rectification plate 42 disposed to rectify the supplied air into a laminar flow. The air is made to be an air of laminar flow after passing through rectification plate 42. Liquid connections 24, 25 are connected open to a liquid storage 43, which is an oblong space extending in X direction. Liquid storage 43 is a relatively small space for the flow volume, and the liquid stored in liquid storage 43 is made not to spout under a normal pressure. Liquid storage 43 is connected through with air path 41 at a part below rectification plate 42. The side wall 43a of air path 41, which is below the level of liquid storage 43, is made to be hydrophilic. On the other hand, side wall 43b is made to be water-repellent. Side wall 43a is made to be hydrophilic in order to make a liquid to spout continuously like a curtain smoothly without break; while, side wall 43b is made to be water-repellent in order for the laminar air flow not to be disturbed by a possible stain of liquid sticking on the surface.

When nozzle 4 having the above structure is supplied with the air and liquid under a controlled volume of flow and pressure, a laminar flow of air 45 is spouted out of slit 20 and liquid 46 is spouted accompanied by air 45 like a curtain from slit 20. Liquid 46 spouts continuously accompanied by the air flow even when the volume of supply is small.

Figure 2:
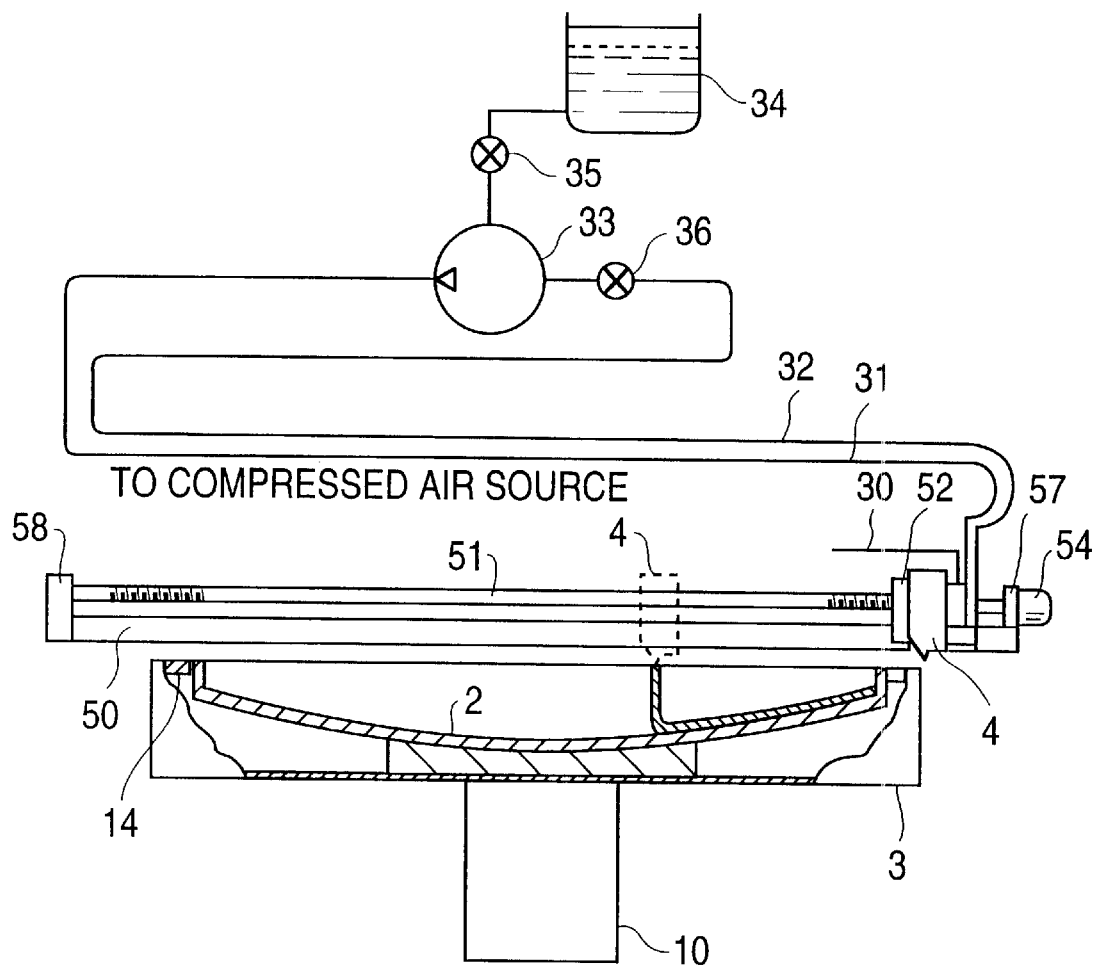
FIG. 2 is a partially sectioned side view of the liquid application apparatus of first embodiment.

Nozzle transfer means 5 comprises, as shown in FIG. 1 and FIG. 2, a pair of guide rails 50 extending in Y direction on both sides of tube holding means 3, a revolving screw axis 51 disposed along one of guide rails 50, and a driving frame 52 and a follower frame 53 disposed at each respective end of nozzle 4. Screw axis 51 is held revolvable at each end by pillows 57, 58, and coupled with a driving motor 54 at pillow 57. Driving frame 52 is provided with a straight pedestal 55 to be guided by guide rail 50, and a nut 56 to be coupling with screw axis 51. Follower frame 53 is provided with a straight pedestal 55 to be guided by guide rail 50.

Now in the following, the operation of a liquid application apparatus according to a first embodiment is described.

Protection glass 2 of cathode ray tube, the object of application, is mounted on tube holding means 3, tube holding means 3 is affixed to revolving section 10 with the longer side in line with Y direction, valve 35 is opened, and valve 36 is shut. Liquid containing fluorescent material which has been circulating through circulation hoses 31, 32 and within nozzle 4 is supplied to nozzle 4 from a tank 34 via circulation hose 31. Nozzle 4 is supplied with a compressed air from a source of compressed air. The compressed air comes from air hose 30, and led to air storage 40 via air intake 23, and develops in X direction to be guided into air path 41. Then the air is rectified to be a laminar flow 45 after passing through rectification plate, and spouted from slit 20.

Meanwhile, the liquid containing fluorescent material supplied from tank 34 by circulation pump 33 via circulation hose 31 is stored in liquid storage 43 through liquid connection 24, and spreads in X direction. And then, the liquid is sucked up by the laminar flow of air, and being accompanied by the laminar flow of air, liquid 46 is spouted downward from slit 20 like a curtain. The quantity of flow at this moment is about 200–500 cc/min., depending on the size of cathode ray tube 2.

After starting the air to spout in laminar flow, and the liquid to spout, nozzle 4 is moved in Y direction maintaining the spouting of liquid, by revolving screw axis 51 with driving motor 54 to shift driving frame 52 in Y direction. Through the process of moving nozzle 4 in Y direction maintaining the spouting, liquid 46 spouted from nozzle 4 in a curtain shape is applied on protection glass 2 of cathode ray tube. The actions of opening valve 35 and closing valve 36 for starting the liquid containing fluorescent material to spout are to be done at a same time. The time needed for moving nozzle 4 in Y direction while spouting depends on the size of cathode ray tube 2; roughly speaking, it is about 2 seconds. After this, valve 35 is closed, and at the same time valve 36 is opened. Then, the liquid containing fluorescent material starts circulating in circulation hoses 31, 32 and within nozzle 4.

After the application of liquid containing fluorescent material is finished, tube holding means 3 is revolved by driving section 10 at 40–50 rpm in order to prevent the liquid from comming to the centre of protection glass 2; in the meantime a heater not illustrated here is disposed above protection glass 2, followed by exposure and developing process steps for forming a flourescent layer.

Because liquid 46 is spouted in a form of curtain of even thickness on protection glass 2 accompanied by laminar flow of air spouted in a plane shape, protection glass 2 is coated with the liquid at even film thickness by simply shifting the location of nozzle 4 against protection glass 2. Thus, through control of the spouting quantity of liquid a thin film of even thickness is formed within a short processing time at a curtailed quantity of liquid consumption. Further, because of the relatively small quantity of flow, the bubbling hardly occurs when the liquid arrives at protection glass 2. Further, because the length of slit 20 is longer than the breadth of protection glass 2 of cathode ray tube, the application is completed by moving nozzle 4 only once against protection glass 2.

After a fluorescent layer is formed at specified areas by a known photolithography, a same process step is repeated for a total of three times to complete fluorescent layers of three colours, green, blue and red, on protection glass 2 in a specified arrangement, e.g. in a matrix form.

Figure 5:
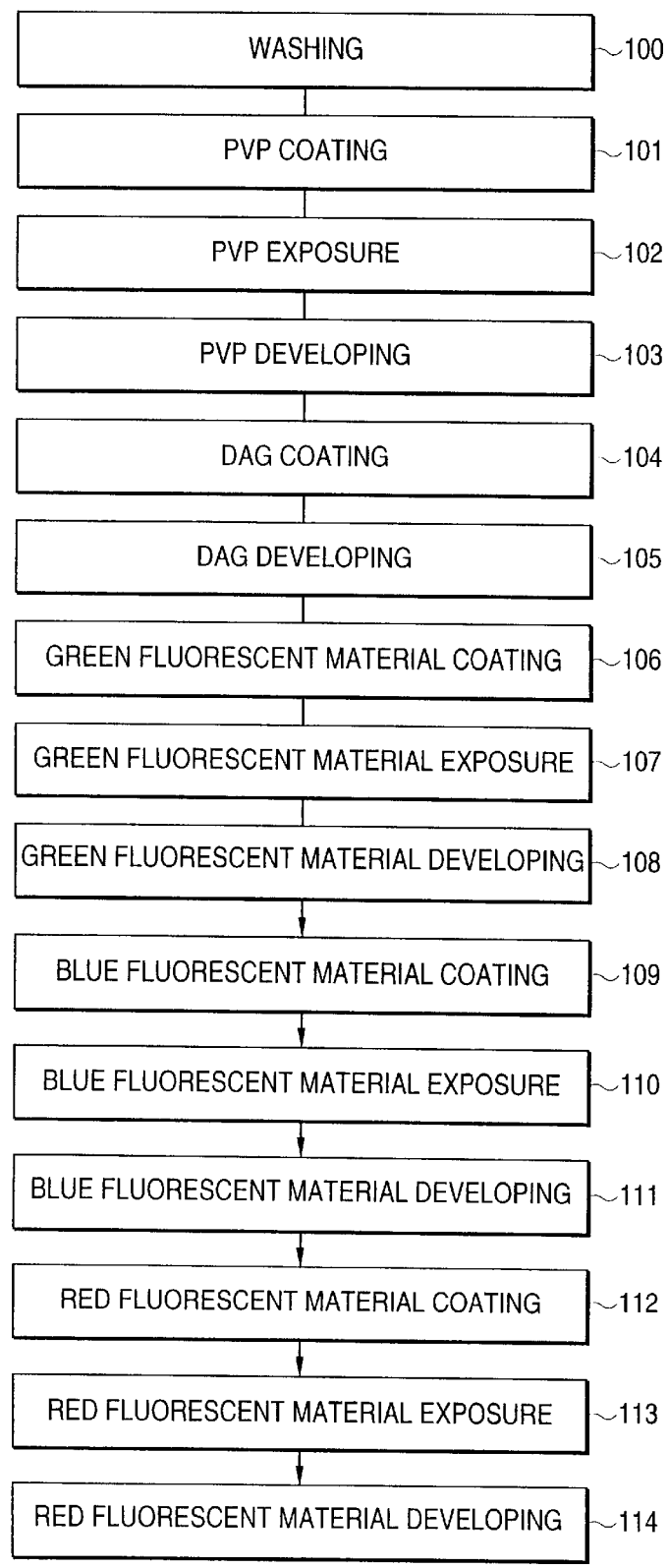
FIG. 5 shows flow chart of manufacturing cathode ray tubes using the liquid application apparatus of first embodiment.

Now referring to FIG. 5, process steps of forming the green, blue and red fluorescent layers on protection glass 2 is described.

In the step 100 of FIG. 5, protection glass 2 is washed, the entire inner surface of protection glass 2 is coated with photosetting paste (PVP) which is used for producing a dot in step 101, exposed in step 102 to harden the PVP in necessary areas, and developed in step 103 to wash off the PVP not hardened. As the result, dots are formed on protection glass 2 in the areas on which the fluorescent layers of respective three colours, green, blue and red, are to be formed. Next, in step 104, black resin (DAG) which is used for producing a partition is applied on the entire surface of protection glass 2 having the dots, and developed in step 105 and the DAG on the dots are washed off. As the result, the DAG layer remains on protection glass 2 as the black matrix layer, in an area other than the areas on which the green, blue and red flourescent layers are to be formed.

In step 106, the entire surface of protection glass 2 is coated with a liquid containing green fluorescent material, and the wet green fluorescent material film is dried with a heater. In step 107, the specified places where the green fluorescent material dot or stripe patterns are to be formed are exposed with light and hardened. In this case, the unexposed portions are remained unhardened. Then, in step 108, it is developed to have unhardened green fluorescent material washed off with water; the green fluorescent layers are thus formed over the dots or stripe patterns only. Next, in step 109, the entire surface of protection glass 2 is coated with a liquid containing blue fluorescent material, and the wet blue fluorescent material film is dried with a heater. In step 110, the specified places where the blue fluorescent material dot or stripe patterns are to be formed are exposed with light and hardened. In this case, the unexposed portions are remained unhardened. In step 111, it is developed to have unhardened blue fluorescent material washed off with water; the blue fluorescent material layers are thus formed over the dots or stripe patterns only. Then, in step 112, the entire surface of protection glass 2 is coated with a liquid containing red fluorescent material, and the wet red fluorescent material film is dried with a heater. In step 113, the specified places where the red fluorescent material dot or stripe patterns are to be formed are exposed with light and hardened. In this case, the unexposed portions are remained unhardened. In step 114, it is developed to have unhardened red fluorescent material washed off with water; the red fluorescent layers are thus formed over the dots or stripe patterns only. As the result, the green, blue and red fluorescent layers are formed over the respective PVA dots on protection glass 2 in a desired arrangement, e.g. in a matrix form.

The fluorescent material layers thus formed are as thin as 100 um, and are formed evenly over the protection glass. Taking advantage of the thin and even thickness of fluorescent material layers, a cathode ray tube of even brightness level and improved white quality is implementable.

Although in the above embodiment the liquid application apparatus 1 has been used for applying a liquid containing fluorescent material in the process steps of coating the three colour fluorescent materials, the liquid application apparatus 1 may of course be employed in applying the PVP and aquadag.

Now in the following, a liquid application apparatus according to a second embodiment of the present invention is described referring to FIG. 6 through FIG. 8.

Figure 6:
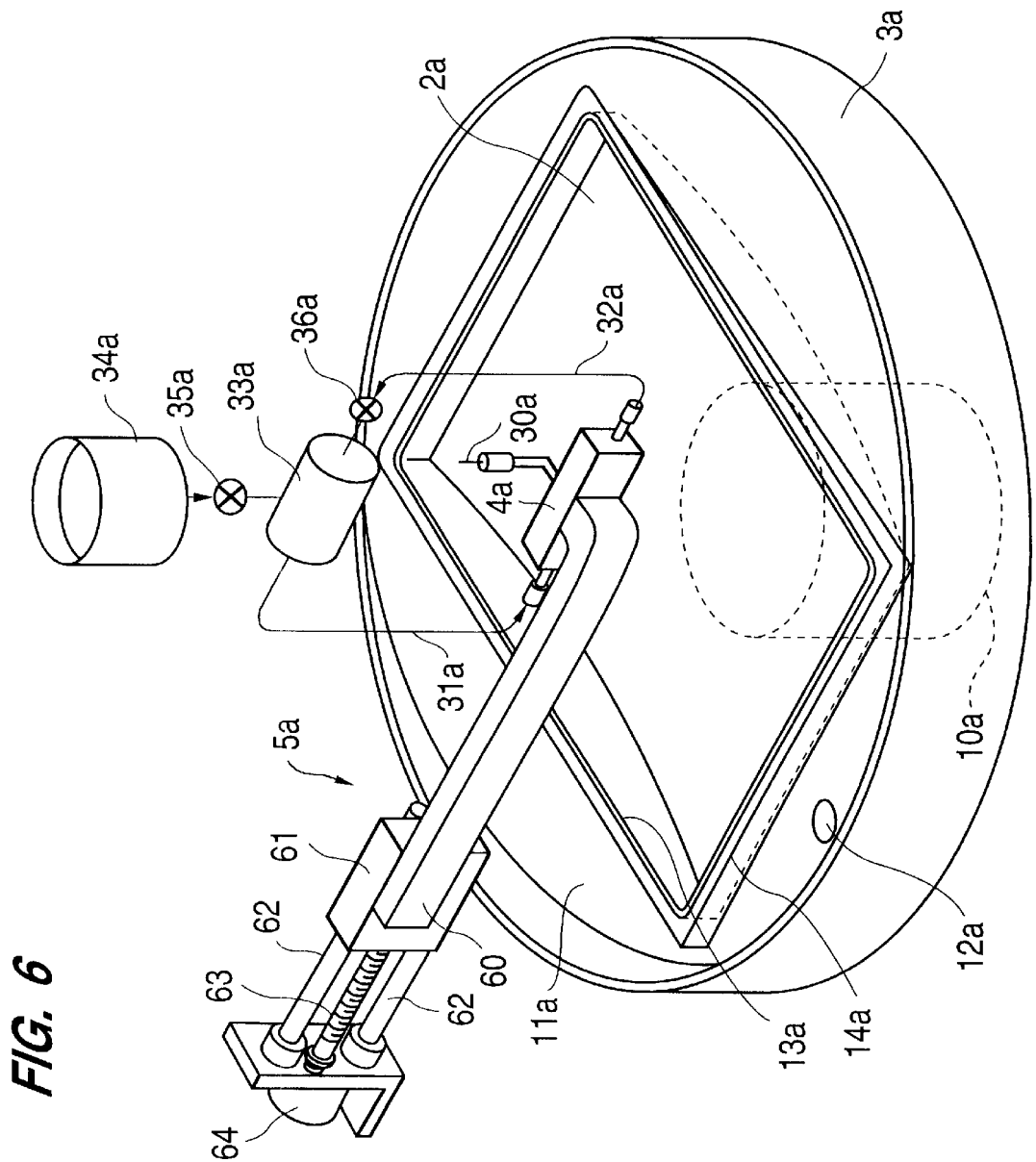
FIG. 6 is a perspective view showing a liquid application apparatus according to a second embodiment of the present invention.
Figure 7:
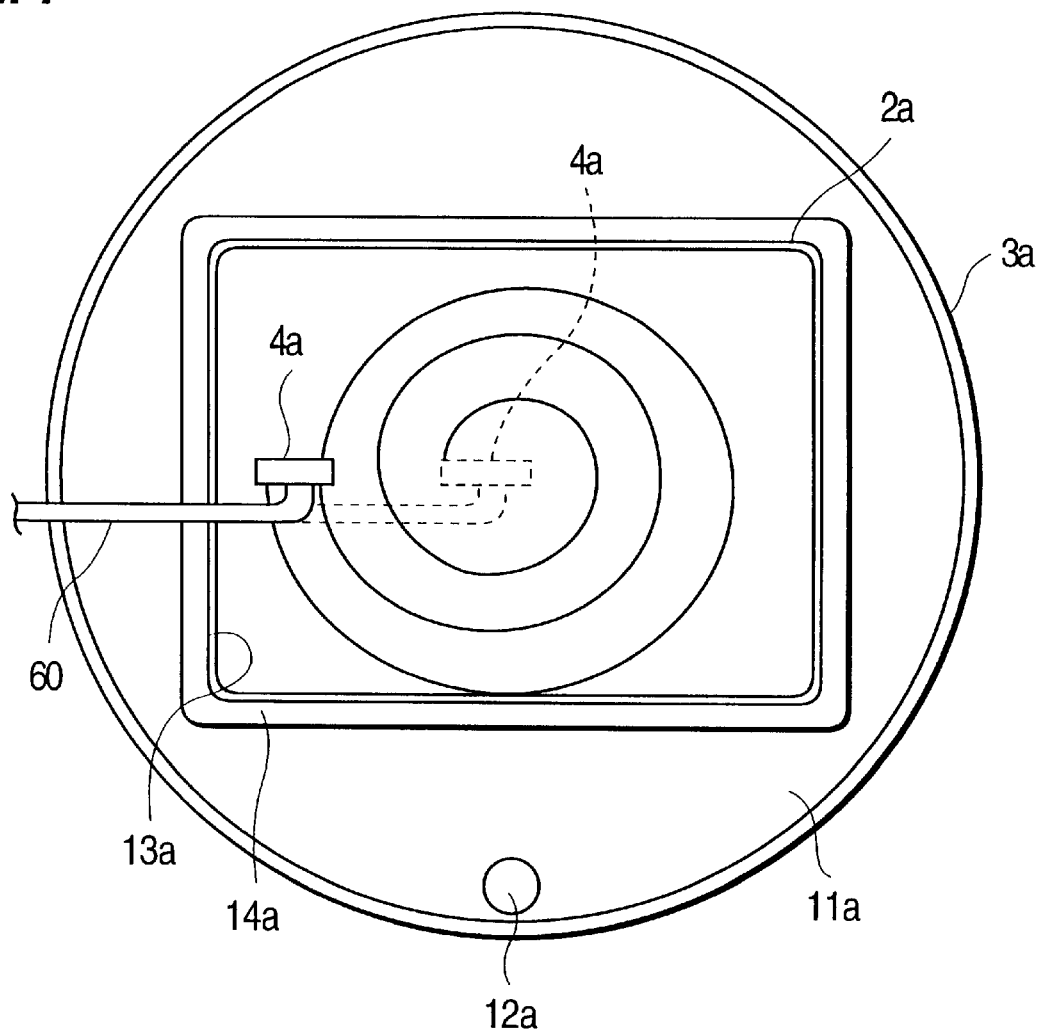
FIG. 7 is a plan view of the liquid application apparatus of second embodiment.
Figure 8:
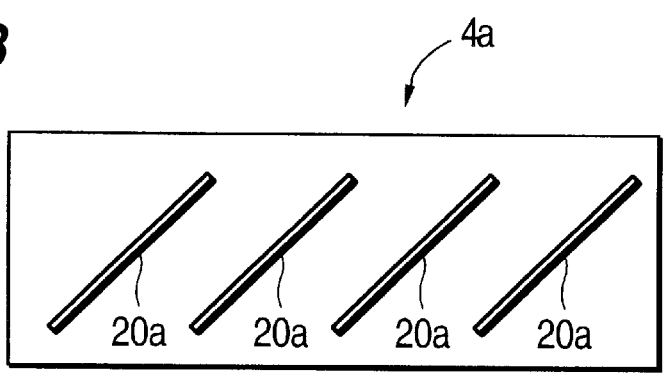
FIG. 8 is a bottom view of a nozzle used in the liquid application apparatus of second embodiment.

As shown in FIG. 6, a liquid application apparatus 1 comprises a disk shaped tube holding means 3a for supporting e.g. a protection glass 2a of 4:3 aspect ratio cathode ray tubes(CRT) revolvable, a nozzle 4a having slit 20a and constituting a spouting section as illustrated in FIG. 7 for spouting a liquid containing fluorescent material on protection glass 2a, and a nozzle transfer means 5a for transferring nozzle 4a on tube holding means 3a in the radius direction.

Tube holding means 3a is a cylindrical-box shaped member having a revolving section 10a driven by a motor at the bottom. The tube holding means 3a comes in various sizes to meet the diversified sizes of protection glass 2a of cathode ray tubes, and is attached detachable to revolving section 10a. Revolving section 10a is controlled to maintain the centrifugal force that effects on the liquid always on a same level; revolving speed gradually slows down as nozzle 4a moves towards the outer circumference. Namely, the revolving speed slows down at the inverse square of the radius where liquid is spouted.

Around the circumferential top surface of tube holding means 3a is a gutter 11a having an inclination for carrying redundant liquid away. A drain hole 12a is provided at the lowest point of gutter 11a, through which redundant liquid is drained for a later reuse. A holding hole 13a of approximately rectangular shape is provided for holding protection glass 2a at the centre of tube holding means 3a. Holding hole 13a is shaped to fit the outer circumference of protection glass 2a, and is provided with a sealing member 14a at the inner wall surface for preventing leakage of liquid.

Nozzle 4a has the inner structure almost identical to that of nozzle 4; therefore, explanation of which is omitted. In nozzle 4a, however, four of slit 20a are disposed aslant in X direction in the bottom face of nozzle body 22a, as illustrated in FIG. 8. The aspect ratio of slit 20a is 5:1. The aspect ratio should preferably be below 10:1, more preferably below 5:1. In the cases where the aspect ratio is below 10:1, liquid is spouted at a high speed in a form closer to a curtain. Four of slit 20a are disposed so that an end of a slit overlaps with the adjacent end of next slit in terms of X direction. The overall length in X direction of four slits 20a is made to be shorter than the breadth of protection glass 2a. Like the case with nozzle 4, nozzle 4a is connected with air hose 30a, circulation hoses 31a, 32a; the circulation hoses 31a, 32a are connected with circulation pump 33a; circulation pump 33a is connected with storage tank 34a.

As the length of slit 20a is short, and the length to breadth ratio is small with nozzle 4a which has the above described structure, liquid is spouted in a form of a curtain with a higher stability in thickness.

Nozzle transfer means 5a comprises, as shown in FIG. 6 and FIG. 7, a holding arm 60 extending in X direction for holding nozzle 4a at the end, a transfer frame 61 attached to the root of holding arm 60, a pair of guide bars 62, top and bottom, for guiding transfer frame 61 in X direction, and a screw axis 63 disposed between and in parallel with guide bars 62. Transfer frame 61 is provided with a straight pedestal (not illustrated here) to be guided by guide bars 62, and a nut (not illustrated here) to be coupled with screw axis 63. Screw axis 63 is connected with a driving motor 64 at one end.

The operation of a liquid application apparatus thus constituted is described in the following.

Protection glass 2a of cathode ray tube, the object of application, is mounted on tube holding means 3a, tube holding means 3a is affixed to revolving section 10a, valve 35a is opened, and valve 36a is shut. Liquid containing fluorescent material which has been circulating through circulation hoses 31a, 32a and within nozzle 4a is supplied to nozzle 4a from storage tank 34a via circulation hose 31a. Nozzle 4a is supplied with a compressed air from a source of compressed air. Then, the liquid starts spouting downward accompanied by the air flow spouting like a curtain from each of slits 20a.

After starting the air to spout in laminar flow, and the liquid to spouting, transfer frame 61 is transferred in X direction(radius direction) by revolving screw axis 63 with driving motor 64, meanwhile tube holding means 3a is revolved by revolving section 10a. As the result, liquid is applied spirally on protection glass 2a, as shown in FIG. 7, by nozzle 4a moving in X direction. As nozzle 4a moves closer to the outer circumference, the revolving speed goes slower, the centrifugal force on the liquid is maintained almost constant; thus, the occurrence of uneven coating, such as "beach-like" unevenness, is suppressed.

After the liquid application is completed, a heater not illustrated is disposed on protection glass 2a, and a fluorescent layer is formed through the process steps of exposure and developing in the same way as in the case with the first embodiment above. By repeating the process step for three times, fluorescent layers of three colours, green, blue and red, are formed on protection glass 2a in a desired arrangement, e.g. in a matrix form.

As slits 20a are shifted while protection glass 2a is revolved, liquid can be evenly applied in a spiral form making use of the centrifugal force. Furthermore, as the aspect ratio of each slit 20a is small, liquid can be spouted in a form of a curtain with a more stable manner; which results in a coating film of even thickness. In addition, as the revolving speed of application object is gradually reduced to maintain the centrifugal force on the applied liquid on a constant level, the applied liquid spreads evenly, which contributes to further reducing the unevenness of coated film.

The fluorescent material layers thus formed are as thin as 100 μm, and are formed evenly over the protection glass. Taking advantage of the thin and even thickness of fluorescent material layers, a cathode ray tube of even brightness level and improved white quality is implementable.

Now in the following, a liquid application apparatus according to a third embodiment of the present invention is described referring to FIG. 9.

Figure 9:
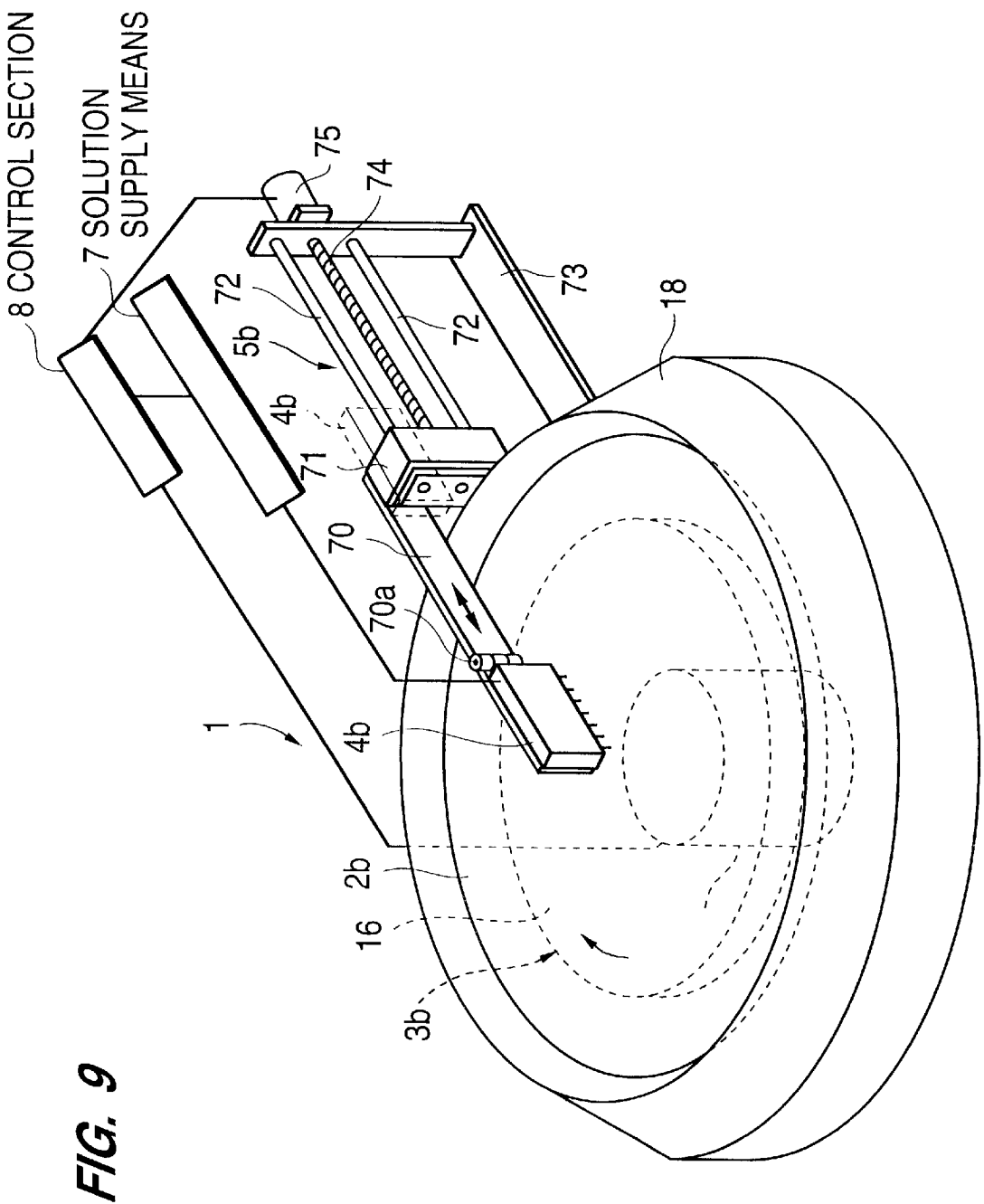
FIG. 9 is a perspective view of a liquid application apparatus according to a third embodiment of the present invention.

As shown in FIG. 9, liquid application apparatus 1 comprises a substrate holding means 3b for sucking/holding an optical disk substrate 2b revolvable, a nozzle 4b for spouting a prescribed solution such as ultraviolet ray curing resin, etc. on optical disk substrate 2b held on substrate holding means 3b, a prescribed solution supply means 7 for supplying prescribed solution to nozzle 4b, a nozzle transfer means 5b for transferring nozzle 4b in the radius direction from the centre of optical disk substrate 2b to the outer circumference, and a control section for controlling substrate holding means 3b, prescribed solution supply means 7 and nozzle transfer means 5b.

Substrate holding means 3b comprises a turntable 16 for sucking optical disk substrate 2b, and a substrate revolving motor 17 for revolving turntable 16. Around substrate holding means 3b, a cup 18 is provided for covering the neighbourhood of optical disk substrate 2b held.

Figure 10:
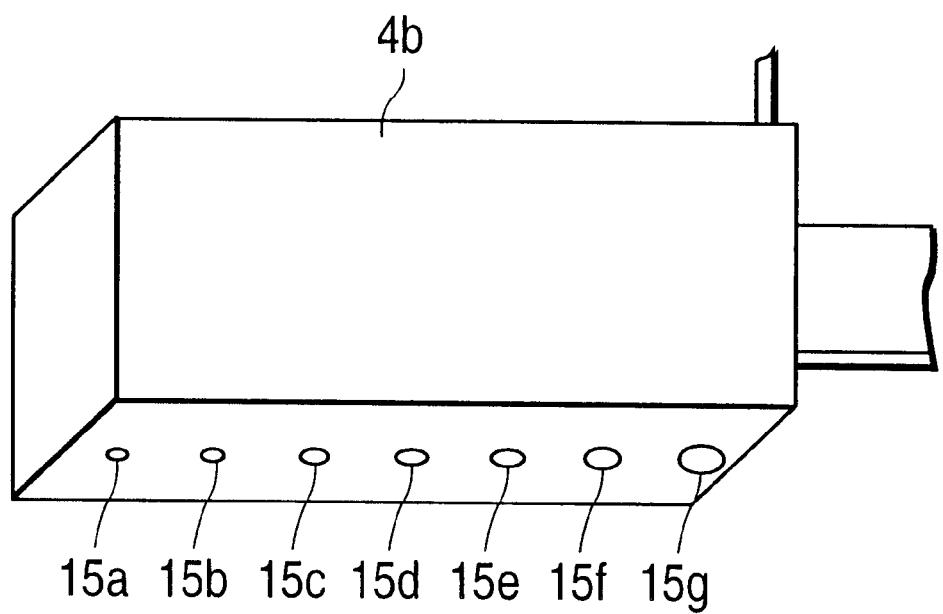
FIG. 10 is a perspecive view of a nozzle used in the third embodiment.

Nozzle 4a comprises a plurality of holes having progressively increasing diameters; for example, as shown in FIG. 10, seven ink-jet type spouting holes 15a–15g. The diameter of spouting holes 15a–15g is determined in proportion to the area of application which increases towards the outer circumference. Spouting holes 15a–15g are disposed on a straight line in one direction. The line of disposing spouting holes 15a–15g may be either in the radius direction of optical disk substrate 2b or on a line crossing with the radius direction at a certain angle. As the area of application goes larger at the outer circumference of optical disk substrate 2b than that at the centre, spouting hole 15a having the smallest diameter is disposed at the innermost of optical disk substrate 2b, while spouting hole 15g having the largest diameter at the outermost.

Prescribed solution supply means 7 comprises, for example, a constant quantity spouting pump the quantity of which is variable, and a pressurized sealed tank, etc. Prescribed solution supply means 7 supplies a specific quantity of prescribed solution to nozzle 4b determined in accordance with the area of application, processing time and the thickness of film to be formed.

Nozzle transfer means 5b transfers nozzle 4b in the radius direction of optical disk substrate 2 between the starting position as shown with solid line and the withdrawal position as shown with broken line in FIG. 9. Nozzle transfer means 5b comprises an arm 70 having nozzle 4b at the end, a transfer frame 71, a pair of guide rails 72, top and bottom, a holding frame 73, a screw axis 74, and a transfer motor 75. Arm 70 comprises in the middle a hinge section 70a for adjusting the posture of nozzle 4b around the vertical axis. Transfer frame 71 is attached at the root of arm 70.

A pair of guide rails 72 guides transfer frame 71 in horizontal direction. Holding frame 73 holds guide rails at both ends, and holds screw axis 74 revolvable. Screw axis 74 is disposed between and in parallel with guide rails 72; and one end is coupled with transfer motor 75. Within transfer frame 71, a sliding pillow (not illustrated) is provided for freely sliding along guide rails 72.

Control section 8 is comprised of microcomputers including CPU, ROM, RAM, etc. Control section 8 is coupled with prescribed solution supply means 7, substrate revolving motor 17, transfer motor 75, and other input/output sections. Control section 8 is further coupled with input keys including a start key for starting the operation, a sensor for detecting revolution position of screw axis 74 and number of revolutions of substrate revolving motor 17, and other sensors.

Now the operation of a liquid application apparatus 1 constituted according to the above is described.

At the starting, nozzle transfer means 5b places nozzle 4b at the withdrawal position as indicated with broken line, awaiting optical disk substrate 2b to be attached on turntable 16. As soon as optical disk substrate 2b is attached on turntable 16, nozzle transfer means 5b places nozzle 4b at the starting position as shown with solid line in FIG. 9, and substrate revolving motor 17 starts revolving optical disk substrate 2b at a constant revolution. Then, prescribed solution supply means 7 is turned ON to have spouting of the prescribed solution started from nozzle 4b to optical disk substrate 2b. And, nozzle 4b is transferred at a constant speed towards the circumference of optical disk substrate 2b. When nozzle 4b arrives at an end of the application, substrate revolving motor 17, transfer motor 75 and prescribed solution supply means 7 are turned OFF. And then, the prescribed solution, or an ultraviolet ray curing resin, is cured, and a layer of ultraviolet ray curing resin is formed on optical disk substrate 2b.

By so doing, an ultraviolet ray curing resin is applied evenly and homogeneously in thin film on an optical disk substrate within a short processing time, and because the ultraviolet ray curing resin is coated thin the curing time is shortened, enabling the formation of a layer of ultraviolet ray curing resin within a short period of time. Thus, an optical disk coated with a thin and even layer of ultraviolet ray curing resin without unevenness is made available in a short processing time.

Now, a liquid spouting nozzle according to an embodiment is described.

Figure 11:
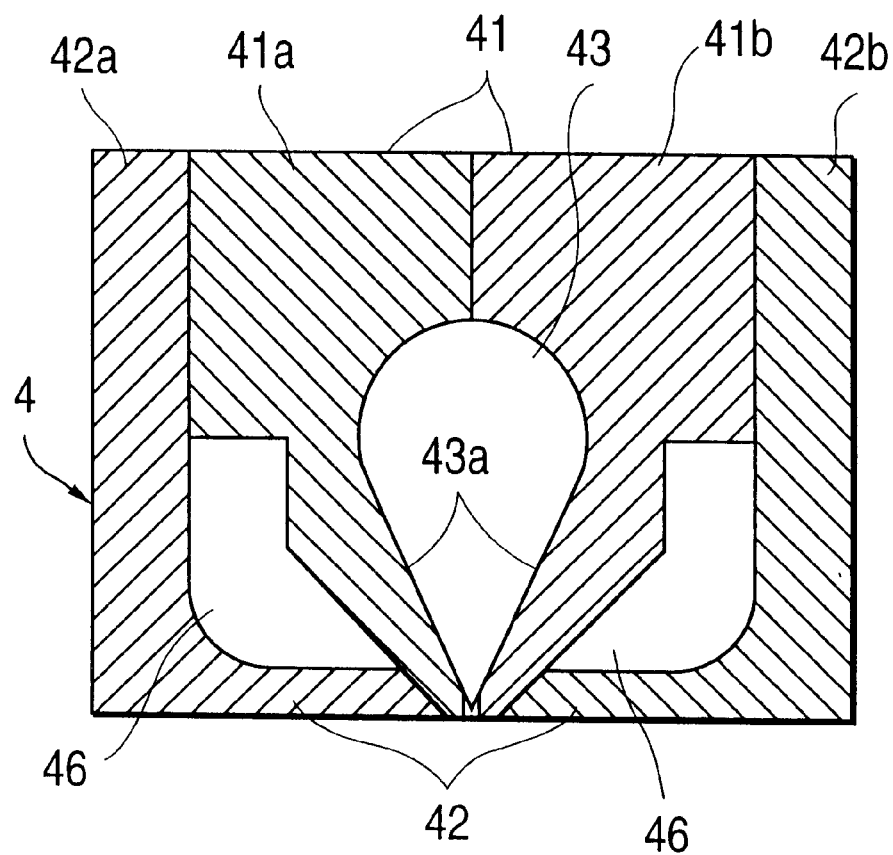
FIG. 11 is a cross sectional view of a nozzle used in a liquid application apparatus according to a fourth embodiment of the present invention.
Figure 12:
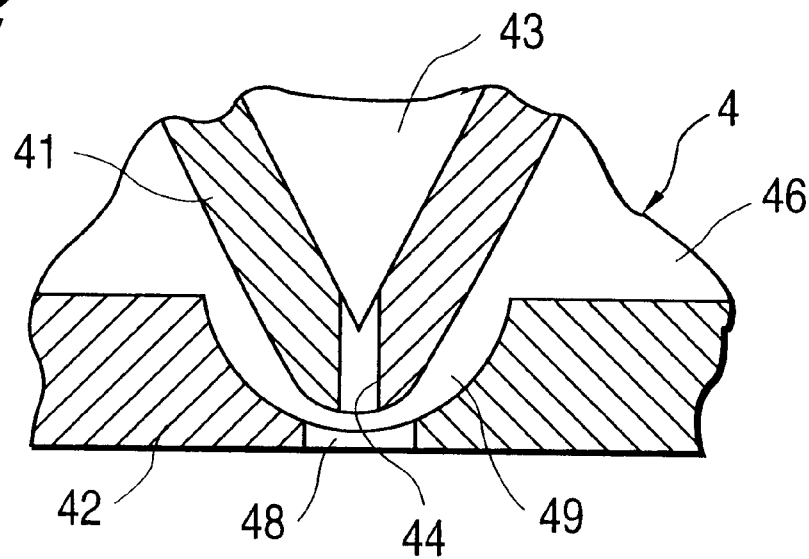
FIG. 12 is a partially magnified view of the key part of the nozzle of fourth embodiment.

As FIG. 11 and FIG. 12 illustrate, a nozzle 4 for applying a liquid comprises a first block 41 and a second block 42.

First block 41 is a long member, the cross section of which has an approximately T shape; a length edge is tapered, and within which a liquid storage 43 extends in the length direction. Liquid storage 43 is a large tunnel extending in the length direction of nozzle 4. At the bottom of liquid storage 43 (the tapered length-edge), there are a great number of small holes 44 disposed along the length direction of first block 41 forming an inner spouting section.

The overall length of a row of small holes 44 can be made sufficiently longer than the length or the breadth of the largest object of application, or a protection glass(not illustrated); may be e.g. 600 mm long, or 1000 mm long.

Second block 42 is a long member, the cross section of which has an approximately U shape, keeps the hermetic contact with the tapered edge of first block 41, and forms an internal cavity 47 outside first block 41, providing a gas storage 46. At the bottom of internal cavity 47, there are a great number of small holes 48 disposed at places immediately underneath small holes 44 forming an outer spouting section.

In a case where small hole 48 is made larger than small hole 44, the liquid flow spouted from small hole 44 passes through small hole 48 with ease. Small holes 44, 48 can take various shapes, e.g. a round, a polygon, a star, an indeterminate, etc. Considering a fact that a spouted liquid/gas tends to assume a circling flow, a hexagonal hole is preferred; a hole of oblong shape is more preferred, therefore an oblong hexagonal hole is further preferred; the most preferred is a hexagonal hole which is oblong in the direction of nozzle length.

The preferred size of both small holes 44, 48 is 0.5–1 mm, considering that the centre to centre distance between the adjacent small holes is e.g. 0.5–2 mm and an object should be coated evenly by a liquid in a manner those spouted from a hole flows sidewise upon reaching the surface of object to get in touch with those from the adjacent hole. Practically, 600 pcs of small holes 44 may be disposed at a centre to centre distance of 1 mm to comply with a 600 mm protection glass, or 1000 pcs of small holes for meeting a 1000 mm protection glass.

First block 41 is comprised of two pieces 41a and 41b, splitted by a perpendicular plane running in the length direction passing through the centres of small holes 44, or the inner spouting section. Second block 42 is comprised of two pieces 42a and 42b, splitted by a perpendicular plane running in the length direction passing through the centres of small holes 44, or the inner spouting section.

Between gas storage 46 and small hole 48, a gas path 49 may be provided for rectifying the gas flow into laminar flow.

With a nozzle of the above described constitution, when a liquid in the liquid storage is spouted from the inner spouting section, a gas in the gas storage is also spouted from the outer spouting section to form a gas flow surrounding the flow of liquid comming down in a form of a line or a curtain from the inner spouting section. Therefore, the liquid flow reaches straight and evenly on the surface of an object of application without being displaced in front or rear directions of a nozzle. In a case where the inner spouting section and the outer spouting section are comprised of small holes, a line-shaped liquid flow is surrounded by a cylindrical gas flow; therefore the liquid flows down straight without being displaced in front or rear directions, nor in the right or left directions of a nozzle.

Figure 13:
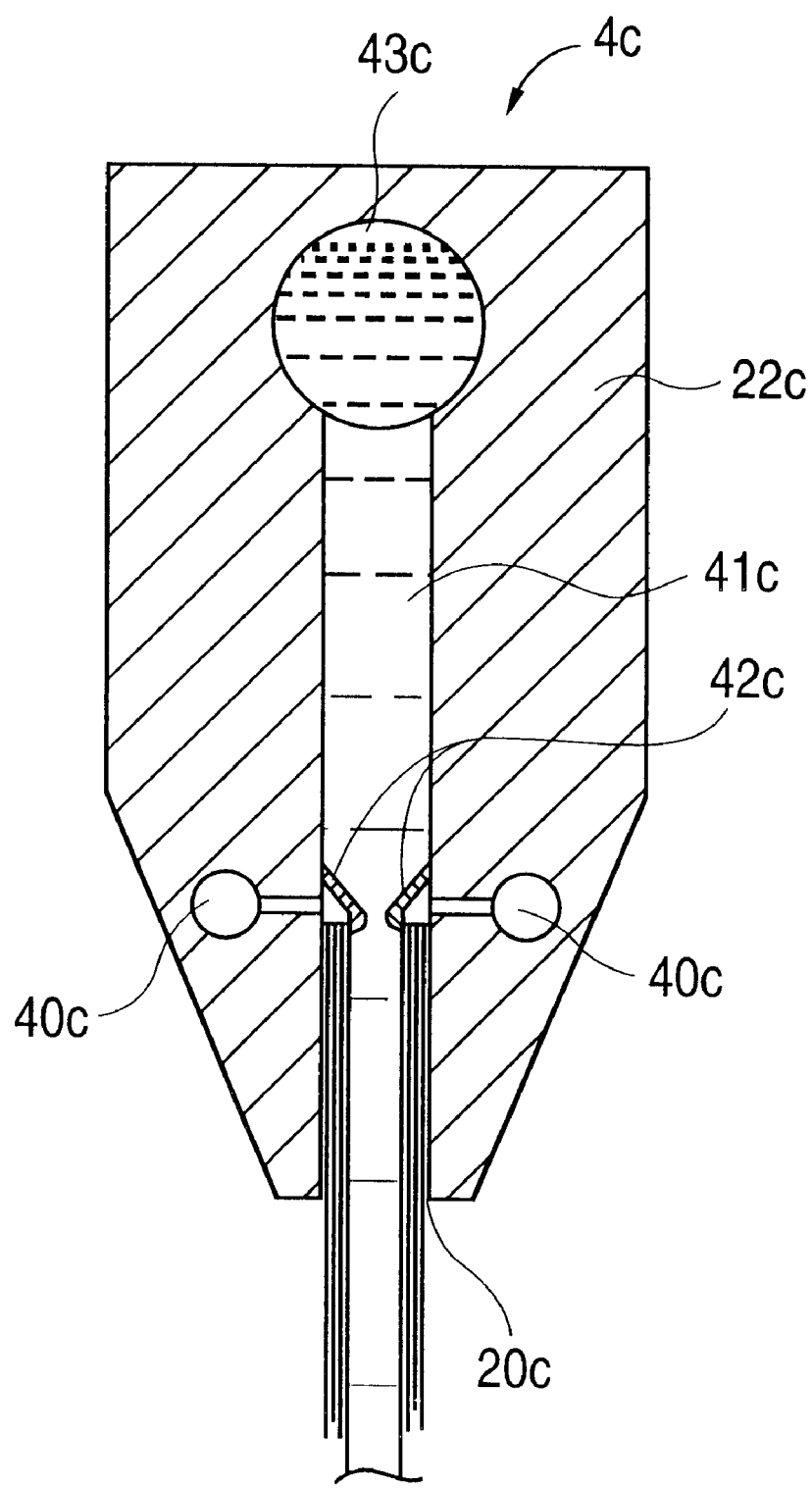
FIG. 13 is a cross sectional view of other nozzle in the liquid application apparatus of fourth embodiment.

As illustrated in FIG. 13, a nozzle 4c may be provided with a liquid storage 43c in the upper part, underneath the liquid storage a liquid path 41c which is connected through with a slit 20c, and a pair of rectifying sections 42c at both sides of liquid path 41c. Rectifying section 42c is connected with an air storage 40c.

With nozzle 4c having the above described constitution, the air is spouted in both sides of liquid like curtains, thus liquid is spouted in the form of a curtain sandwitched by the air.

Figure 14:
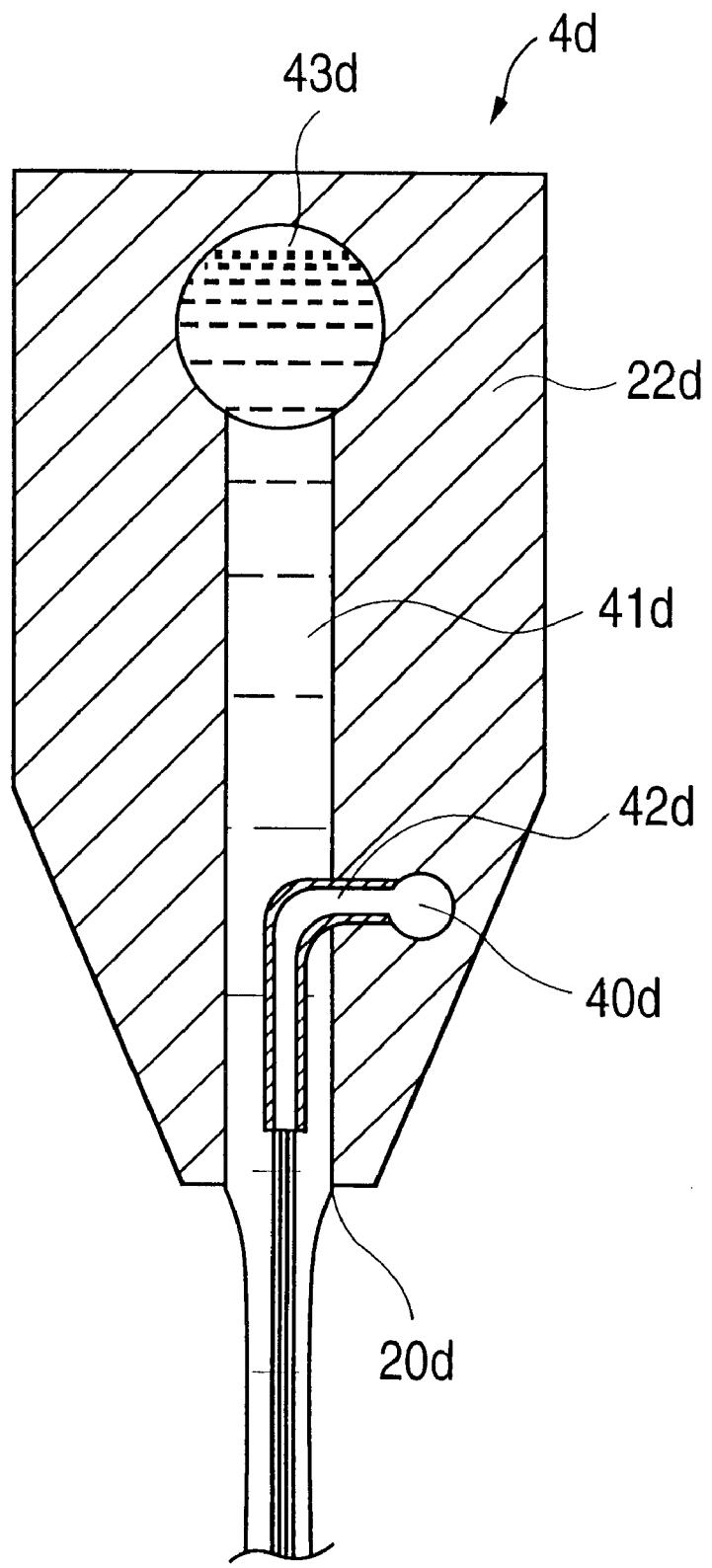
FIG. 14 is a cross sectional view of other nozzle in the liquid application apparatus of fourth embodiment.

Further, as illustrated in FIG. 14, a nozzle 4d may be provided with a liquid storage 43d in the upper part, underneath the liquid storage a liquid path 41d which is connected through with a slit 20d, and a rectifying section 42d bending 90° in the middle of liquid path 41d. Rectifying section 42d is shaped so as not to cause disturbance in the liquid flow. Rectifying section 42d is connected with an air storage 40d.

With nozzle 4d having the above described constitution, liquid is spouted in both sides of the air like curtains.

Figure 15:
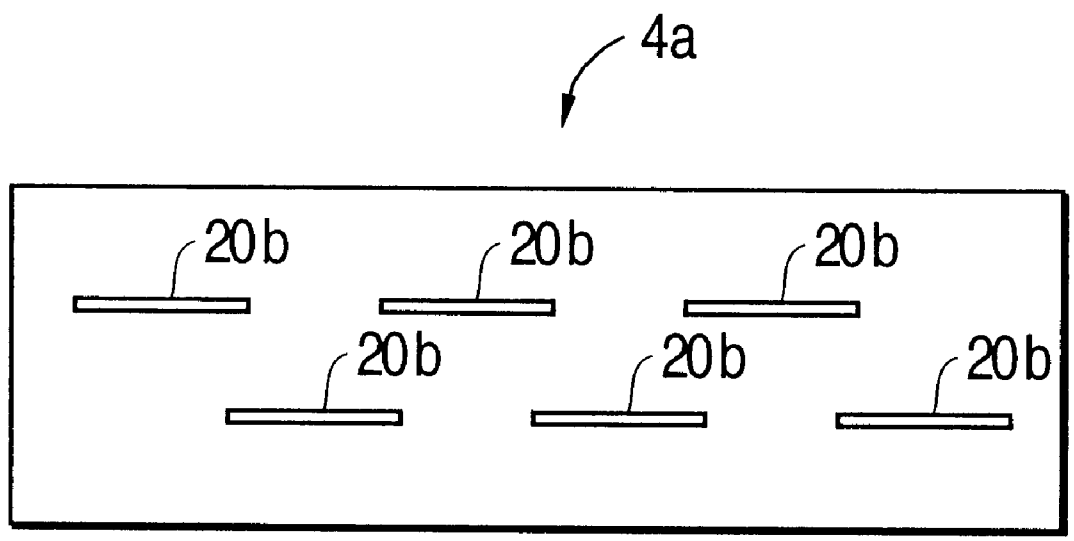
FIG. 15 shows a bottom view of other nozzle in the liquid application apparatus of fourth embodiment.

The arrangement of plural slits (spouting sections) is not limited to that of the second embodiment described above, but slits 20b may be disposed intermittently on a line in two rows with the spaces between the spouting sections alternating to each other as shown in FIG. 15, or in other layouts. In any layout, however, the edges of adjacent slits should preferably be overlapping to each other.

A nozzle having a plurality of slits (spouting sections) may be employed in the first embodiment described above, or a slit nozzle comprised of a single slit may be used in the second embodiment.

As described above, in a liquid application method according to the present invention and an apparatus using the same liquid application method, because a liquid is spouted along with a plane form gas flow on an object of application, the object is coated with the liquid maintaining a specific film thickness, by simply shifting the relative positioning between the nozzle and the coating object. Through control of the quantity of liquid to be applied, a thin coating film having least unevenness in the thickness can be provided quickly at a curtailed liquid consumption. Further, as a gas is spouted in laminar flow, a liquid is spouted accompanied by the gas flow like a curtain, resulting in a stable spouting of liquid.

By disposing a nozzle, length of which is longer than a length in a direction of an object of application, in line with the direction, and shifting the relative positioning of said nozzle straight in a direction crossing the direction along which said nozzle is disposed, a liquid is applied to cover the whole surface of an object with one way shifting of the relative positioning. Thus, the application time is further shortened.

Further, by providing a nozzle with a plurality of spouting sections to make the overall length longer than a length in a direction of an object of application, and disposing said nozzle along said direction, and shifting the relative positioning of said nozzle straight in a direction crossing the direction along which said nozzle is disposed, a liquid is applied to cover the whole surface of an object with one way shifting of the relative positioning, the application time is thus further shortened; moreover, because the aspect ratio of each spouting section is reduced the spouting of liquid in a curtain form is performed in more stable manner, resulting in the formation of a coating film having more homogeneous film thickness.

By disposing plural spouting sections in an aslant arrangement, or by disposing plural spouting sections intermittently on a line in two rows with the spaces between the spouting sections alternating to each other, a coating film of even film thickness is swiftly formed without break between the slits, even when plural slits are used, and gas and liquid are spouted from plural slits of relatively shorter length.

Further, by revolving an object of application and shifting a nozzle from the centre of said object towards the outer circumference, a liquid is applied evenly in a spiral form because the nozzle is moved while the object of application is being revolved. When, by gradually reducing the number of revolutions of the object along with the move of nozzle from the centre towards outer circumference in order to maintain the centrifugal force to be exerted on the applied liquid on a constant level, the applied liquid spreads more evenly, and the unevenness is further reduced.

By disposing plural spouting sections so as to make the overall length of nozzle shorter than a length of an object of application in a direction, and shifting said nozzle from the centre to outer circumference of said object in a direction on which the spouting sections are disposed while revolving said object, a liquid is applied evenly in a spiral form by making use of the centrifugal force; and because of the reduced aspect ratio of each of the spouting sections, liquid is spouted like a curtain in more stable manner producing a coating film of more even film thickness.

In a method of manufacturing cathode ray tubes according to the present invention, a nozzle is disposed facing to a protection glass, and as a fluorescent material layer is formed in specified places on said protection glass by applying a liquid containing fluorescent material spouted along a gas flow spouted in a plane form towards said protection glass from said nozzle while shifting the positioning of said protection glass relative to said nozzle spouting the liquid, the liquid containing fluorescent material spouts continuously without breake, even if the level of supply quantity is low, led by gas flow, to be applied swiftly on the protection glass as a thin coating film of even thickness; because of the thin coating of liquid containing fluorescent material the drying time is shortened making the processing time for forming a fluorescent material layer shorter; and because of the thin and even thickness of fluorescent material layers thus produced cathode ray tubes having a homogeneous brightness level and an improved white quality become available.

In a method of manufacturing optical disks according to the present invention, a nozzle is disposed facing to a revolving optical disk substrate, and as a layer of ultraviolet ray curing resin is formed on said optical disk substrate by spouting an ultraviolet ray curing resin along a gas flow spouted in a plane form towards said optical disk substrate while shifting the nozzle from the centre towards outer circumference of said optical disk substrate, the ultraviolet ray curing resin is applied evenly and homogeneously in thin film on an optical disk substrate within a short processing time; because of the thin ultraviolet ray curing resin film the curing time is shortened enabling the formation of a layer of ultraviolet ray curing resin within a short period of time; thus, optical disks coated with a thin and even layer of ultraviolet ray curing resin with least unevenness can be produced within a short processing time.

A nozzle according to the present invention comprises a single long spouting section or a plurality of spouting sections stretching in one direction, wherein said spouting section is comprised of a gas spouting section for spouting a gas in a plane form as laminar flow and a liquid spouting section for spouting a liquid along with the gas spouted from said gas spouting section; and an object of application is coated with a liquid spouted along the gas spouted from said gas spouting section; therefore, a liquid is spouted along a gas spouted in a plane form and the liquid is applied on an object maintaining a constant film thickness by simply shifting the relative positioning of spouting section and object of application. In this way, through control of the quantity of spouting liquid, a thin and even coating film of liquid having least unevenness is formed at a curtailed liquid consumption within a short processing time.

By making both ends of a spouting section broader than the rest part, the quantity of flow at both ends increases and a slim-down phenomenon of liquid flow at both ends due to the surface tension becomes difficult to occur; and a liquid is spouted assuming a form closer to real rectangular curtain.

Further, as a gas and a liquid are spouted from a single long spouting section, or a plurality of spouting sections, overall length of which is longer than the length of an object of application in one direction, the liquid is applied on the entire surface of an object by shifting the relative positioning only once; thus, the time for application is shortened. In the case, where plural spouting sections are employed, the aspect ratio of each spouting section can be made smaller, which brings about a liquid spouting in more stable manner, and formation of a coating film having a more even thickness.

Further, by spouting a gas and a liquid from a single spouting section or a plurality of spouting sections, overall length of which is shorter than the length of an object of application in one direction, the liquid is applied evenly on the object in a spiral shape utilizing the centrifugal force through revolution of the object and shifting of the nozzle in the direction in which the spouting section is formed. In the case where there are plural spouting sections, the aspect ratio of each spouting section can be made small, which brings about a spouting of a curtain form liquid in a more stable manner; therefore, a coating film of more even film thickness is produced.

By making a gas to spout in a plane form at both sides of a spouted liquid, the spouted liquid is made to take a shape more closer to a curtain, bringing about the formation of a coating film of more even film thickness. By making a liquid to spout at both sides of a spouted gas, the flow quantity of liquid is increased and the time for applying liquid can be made shorter.

By disposing a rectifying section in gas path, a turbulent flow of gas taken in at a gas intake is rectified into laminar flow.

By coupling a liquid connection for introducing a liquid with a gas path in the down stream of rectifying section through a liquid path, a liquid can be made to surely follow the laminar gas flow.

What is claimed is:

1. A liquid application method comprising dispensing a liquid accompanied by a gas from a nozzle disposed facing an object of application, and a relative-transfer process for transferring said object of application relative to said nozzle while dispensing said liquid, said gas being processed so as to exhibit a laminar flow prior to engaging said liquid, said gas operative for forcing said liquid out of said nozzle at a substantially constant rate and for coating said liquid on said object of application, said liquid being dispensed from an opening in said nozzle that is located a greater distance from said object than an opening in said nozzle from which said gas is dispensed, said gas being dispensed via a tapered, arcuately shaped channel such that said gas engages said liquid substantially perpendicular to the direction of flow of said liquid.

2. A liquid application method according to claim 1, wherein said gas and said liquid are dispensed such that said liquid is surrounded by a cylindrical gas flow.

3. The liquid application method of claim 1, wherein in the relative-transfer process said nozzle whose overall length is longer than the length of an object of application in one direction is disposed in line with the direction, and performs a relative movement on a straight line crossing with the direction on which said nozzle is disposed.

4. The liquid application method of claim 1, wherein said nozzle comprises a plurality of spouting sections so that overall length is longer than the length of an object of application in one direction, and in the relative-transfer process said nozzle is disposed in line with said one direction and performs a relative movement on a straight line crossing with the direction on which said nozzle is disposed.

5. The liquid application method of claim 4, wherein said nozzle comprises a plurality of dispensing sections disposed in an aslant arrangement.

6. The liquid application method of claim 4, wherein said nozzle comprises a plurality of dispensing sections disposed intermittently on a line in two rows with the spaces between dispensing sections alternating to each other.

7. The liquid application method of claim 1, wherein in the relative-transfer process of an object of application is revolved while said nozzle is moved from the center towards an outer circumference of said object of application.

8. The liquid application method of claim 7, wherein in the relative-transfer process the revolving speed of an object of application is gradually decreased along with the movement of said nozzle from the center to said outer circumference in order to maintain the centrifugal force to be exerted on the applied liquid at a constant level.

9. The liquid application method of claim 1, wherein said nozzle comprises a plurality of dispensing sections so that the overall length is shorter than the length of an object of application in one direction, and in the relative-transfer process said object of application is revolved while said nozzle is moved from the center to an outer circumference of said object of application in the direction on which the dispensing sections are disposed.

10. A method of manufacturing cathode ray tubes, wherein a nozzle is disposed facing a protection glass, and a layer of fluorescent material is formed in specified areas on said protection glass by dispensing a liquid containing fluorescent material accompanied by a gas from said nozzle towards said protection glass while transferring the relative positioning between said protection glass and said nozzle, said gas being processed so as to exhibit a laminar flow prior to engaging said liquid, said gas operative for forcing said liquid out of said nozzle at a substantially constant rate, said liquid being dispensed from an opening in said nozzle that is located a greater distance from said object than an opening in said nozzle from which said gas is dispensed, said gas being dispensed via a tapered, arcuately shaped channel such that said gas engages said liquid substantially perpendicular to the direction of flow of said liquid.

11. The cathode ray tube manufacturing method of claim 10, comprising process steps of forming dots on a protection glass by applying photosetting paste which is used for producing a dot and developing it after exposure, forming a black matrix by applying black resin which is used producing a partition and developing it, forming a green fluorescent layer in specified places on said dots by applying a liquid containing green fluorescent material, hardening said specified places by light exposure and developing, forming a blue fluorescent layer in specified places on said dots by applying a liquid containing blue fluorescent material, hardening said specified places by light exposure and developing, and forming a red fluorescent layer in specified places on said dots by applying a liquid containing red fluorescent material, hardening said specified places by light exposure and developing; wherein at least in the process of applying liquids of the three colour fluorescent materials, a liquid containing fluorescent material accompanied by a gas flow is dispensed in a plane form towards said protection glass from a nozzle facing said protection glass while shifting the relative positioning between said nozzle and said protection glass.

12. A method of manufacturing cathode ray tubes according to claim 10, wherein said gas and said liquid are dispensed such that said liquid is surrounded by a cylindrical gas flow.

13. A method of manufacturing optical disks, wherein a nozzle is disposed facing an optical disk substrate, and a layer of ultraviolet ray curing resin is formed on said optical disk substrate by dispensing an ultraviolet ray curing resin accompanied by a gas from said nozzle towards said optical disk substrate while shifting the nozzle from the center to outer circumference of said optical disk substrate, said optical disk substrate revolving during said dispensing of said curing resin, said liquid being dispensed from an opening in said nozzle that is located a greater distance from said object than an opening in said nozzle from which said gas is dispensed, said gas being dispensed via a tapered, arcuately shaped channel such that said gas engages said liquid substantially perpendicular to the direction of flow of said liquid.

14. A method of manufacturing optical disks according to claim 13, wherein said gas and said liquid are dispensed such that said liquid is surrounded by a cylindrical gas flow.

* * * * *